US012378459B2

(12) United States Patent
Choa et al.

(10) Patent No.: US 12,378,459 B2
(45) Date of Patent: Aug. 5, 2025

(54) THERMAL DISSIPATION COMPOSITE MATERIAL AND MANUFACTURING METHOD THEREOF

(71) Applicant: INDUSTRY-UNIVERSITY COOPERATION FOUNDATION HANYANG UNIVERSITY ERICA CAMPUS, Ansan-Si (KR)

(72) Inventors: Yong Ho Choa, Ansan-si (KR); Seung Han Ryu, Ansan-si (KR); Min Seob Lim, Ansan-si (KR); Hong Baek Cho, Ansan-si (KR); Yo Seb Song, Ansan-si (KR)

(73) Assignee: INDUSTRY-UNIVERSITY COOPERATION FOUNDATION HANYANG UNIVERSITY ERICA CAMPUS, Ansan-Si (KR)

( * ) Notice: Subject to any disclaimer, the term of this patent is extended or adjusted under 35 U.S.C. 154(b) by 583 days.

(21) Appl. No.: 17/643,307

(22) Filed: Dec. 8, 2021

(65) Prior Publication Data

US 2022/0098463 A1 Mar. 31, 2022

Related U.S. Application Data

(63) Continuation of application No. PCT/KR2020/009743, filed on Jul. 23, 2020.

(30) Foreign Application Priority Data

Jul. 23, 2019 (KR) .................. 10-2019-0088778

(51) Int. Cl.
*C09K 5/14* (2006.01)
*F28F 13/00* (2006.01)
*H05K 7/20* (2006.01)

(52) U.S. Cl.
CPC ............... *C09K 5/14* (2013.01); *F28F 13/00* (2013.01); *H05K 7/20463* (2013.01); *F28F 2013/006* (2013.01)

(58) Field of Classification Search
None
See application file for complete search history.

(56) References Cited

U.S. PATENT DOCUMENTS

| | | | |
|---|---|---|---|
| 6,576,330 B1 | 6/2003 | Schenck et al. | |
| 2014/0342231 A1* | 11/2014 | Kawasaki | C01B 32/05 429/231.2 |
| 2019/0201970 A1* | 7/2019 | Lehmann | B22C 1/00 |
| 2021/0221743 A1 | 7/2021 | Huang | |

FOREIGN PATENT DOCUMENTS

| | | |
|---|---|---|
| CN | 109988409 B | 10/2021 |
| EP | 2 607 420 A1 | 6/2013 |

(Continued)

OTHER PUBLICATIONS

Li et al., "Machinable Al2O3/BN composite ceramics with strong mechanical properties", Materials Research Bulletin, vol. 37, issue 8, pp. 1401-1409 (2002).

(Continued)

*Primary Examiner* — Mandy C Louie
(74) *Attorney, Agent, or Firm* — Finch & Maloney PLLC

(57) ABSTRACT

A thermal dissipation composite material comprising: a matrix including a polymer material; and composite particles distributed in the matrix, wherein the composite particles include a filler, and a thermally conductive material coated on the surface of the filler by an inorganic coating layer, and wherein the plurality of thermally conductive materials coated by the inorganic coating layer are connected to each other on the surfaces of the plurality of composite particles so as to establish a heat transfer network.

5 Claims, 10 Drawing Sheets

(56) References Cited

FOREIGN PATENT DOCUMENTS

| | | | | |
|---|---|---|---|---|
| JP | 2013-136658 A | | 7/2013 | |
| JP | 2016192474 | * | 11/2016 | ........... H01L 23/373 |
| KR | 20120046523 | * | 5/2012 | ............. C08K 13/02 |
| KR | 10-1237001 B1 | | 2/2013 | |
| KR | 10-2017-0046570 A | | 5/2017 | |
| KR | 10-1797671 B1 | | 11/2017 | |
| WO | 02/10496 A1 | | 2/2002 | |

OTHER PUBLICATIONS

Pan et al., "Investigation of the dielectric and thermal conductive properties of core-shell structured HGM@hBN/PTFE composites", Materials Science & Engineering B, vols. 238-239, pp. 61-70 (Dec. 2018).

Shi et al., "Effects of weak boundary phases (WBP) on the microstructure and mechanical properties of pressureless sintered Al2O3/h-BN machinable composites",. Materials Science & Engineering A, vol. 492, pp. 29-34 (2008).

Stolyarov et al., "Structure and properties of Al2O3 / Graphene nanocomposite processed by spark plasma sintering", IOP Conf. Series: Materials Science and Engineering 218 (2017).

International Search Report for International Application. No. PCT/KR2020/009743 mailed Nov. 3, 2020, 3 pages.

Written Opinion of the International Searching Authority for International Application No. PCT/KR2020/009743 mailed Nov. 3, 2020, 4 pages.

\* cited by examiner

THERMAL DISSIPATION COMPOSITE MATERIAL AND MANUFACTURING METHOD THEREOF

TECHNICAL FIELD

The present invention relates to a thermal dissipation composite material and a manufacturing method thereof, and more particularly, to a thermal dissipation composite material in which a surface of a filler is coated with a thermally conductive material by an inorganic coating layer formed by curing an inorganic binder, and a method of manufacturing the thermal dissipation composite material.

BACKGROUND ART

A thermal dissipation composite material refers to a material that may conduct heat by using at least two materials among polymer, ceramic, or metal materials.

The heat conduction of the thermal dissipation composite material is performed by allowing heat generated from a specific device to be conducted by a thermally conductive material of the thermal dissipation composite material to release the heat generated from the specific device.

Accordingly, the thermal dissipation composite material may be applied to various industries such as fields of a head lamp of an LED, a CPU and a main board of a computer, a display, a mobile phone battery, and an electric vehicle.

As the application field expands, thermal dissipation composite materials with high thermal dissipation characteristics have been researched. For example, Korean Patent Registration No. 10-179767 discloses a method of manufacturing a silver-carbon nanocomposite for a thermal dissipation material, the method including: a first step of preparing a mixed powder by mixing a graphite powder and a silver powder with each other at a predetermined ratio; and a second step of forming the silver-carbon nanocomposite by irradiating the mixed powder with microwaves under a predetermined gas atmosphere, wherein, before the first step, the method further includes a step of pre-treating the graphite powder by one scheme selected from a microwave treatment or a plasma treatment; the graphite powder is exfoliated by the irradiation with the microwaves in the second step to form graphene, and the graphene reacts with the silver powder to form the silver-carbon nanocomposite having a structure in which silver particles are grown on a surface of the graphene as nanoparticles; the mixed powder is self-heated to a temperature of 400 to 1700° C. by the microwaves used in the irradiation in the second step to form the silver-carbon nanocomposite; and the silver-carbon nanocomposite has a thermal diffusivity of 140 to 170 $mm^2/S$, and a Vickers hardness of 70 to 140 HV.

DISCLOSURE

Technical Problem

One technical object of the present invention is to provide a thermal dissipation composite material having improved thermal conductivity, and a manufacturing method thereof.

Another technical object of the present invention is to provide a thermal dissipation composite material having improved thermal conductivity in a vertical direction, and a manufacturing method thereof.

Still another technical object of the present invention is to provide a thermal dissipation composite material and a manufacturing method thereof, capable of reducing a manufacturing process cost.

Yet another technical object of the present invention is to provide a thermal dissipation composite material and a manufacturing method thereof, capable of reducing a manufacturing time.

Still yet another technical object of the present invention is to provide a thermal dissipation composite material and a manufacturing method thereof, capable of facilitating mass production.

The technical objects of the present invention are not limited to the above-described technical objects.

Technical Solution

In order to achieve the above technical objects, the present invention provides a method of manufacturing a thermal dissipation composite material.

According to one embodiment, the method of manufacturing the thermal dissipation composite material includes: preparing a first mixture by mixing an inorganic binder and a filler with each other; preparing a second mixture by mixing a thermally conductive material with the first mixture; preparing a composite particle in which a surface of the filler is coated with the thermally conductive material by an inorganic coating layer formed by curing the inorganic binder, by thermally treating the second mixture; and preparing the thermal dissipation composite material by mixing the composite particle and a polymer material with each other.

According to one embodiment, the preparing of the first mixture may include: providing a solvent to the inorganic binder, and performing stirring; and preparing the first mixture by providing the filler to the solvent and the inorganic binder, which are stirred, and performing stirring.

According to one embodiment, the preparing of the second mixture may include: generating an OH functional group on a surface of the thermally conductive material by thermally treating the thermally conductive material; and preparing the second mixture by providing the thermally conductive material on which the OH functional group is generated to the first mixture and performing stirring.

According to one embodiment, the thermally conductive material may be thermally treated in an oxygen atmosphere, and the thermally conductive material on which the OH functional group is generated and the inorganic coating layer may be chemically combined with each other.

According to one embodiment, the inorganic binder may include at least one of compounds that form a metal oxide through a thermal treatment, such as a metal alkoxide including at least one alkoxide such as magnesium dialkoxide, aluminum triethoxide, or silicon trimethoxide, water glass, siloxane, or silazane.

According to one embodiment, the solvent may include a non-polar solvent.

In order to achieve the above technical objects, the present invention provides a thermal dissipation composite material.

According to one embodiment, the thermal dissipation composite material includes: a matrix including a polymer material; and a composite particle distributed in the matrix, wherein the composite particle includes a filler and a thermally conductive material in which a surface of the filler is coated with the thermally conductive material by an inorganic coating layer.

According to one embodiment, a plurality of composite particles may be provided in the matrix, and a plurality of thermally conductive materials, in which surfaces of the composite particles are coated with the thermally conductive materials by the inorganic coating layer, may be connected to each other so as to establish a heat transfer network.

According to one embodiment, the filter may include at least one of a metal such as copper (Cu), iron (Fe), silver (Ag), magnesium (Mg), nickel (Ni), silicon (Si), aluminum (Al), or tungsten (W), and an oxide, a carbide, or a nitride, which is derived from the metal.

According to one embodiment, the thermally conductive material may include at least one of amorphous BN, h-BN, c-BN, or a boron nitride nanotube (BNNT), which is a boron nitride-based material, graphite, graphene, or a carbon nanotube (CNT), which is a graphite-based material, SiN, SiC, or AlN.

According to one embodiment, the inorganic coating layer may include at least one metal oxide such as a magnesium oxide, an aluminum oxide, or a silicon oxide.

According to one embodiment, the polymer material may be configured as a thermoplastic resin and a thermosetting resin polymer, which are used alone or used by blending at least two types thereof.

In order to achieve the above technical objects, the present invention provides an electronic element into which a thermal dissipation composite material is inserted.

The electronic element includes: a heat generation for generating heat; a heat sink for releasing the heat; and a thermal dissipation composite material according to the above-described embodiment, which is disposed between the heat generation and the heat sink to transfer the heat generated from the heat generation to the heat sink.

Advantageous Effects

According to the embodiment of the present invention, the method of manufacturing the thermal dissipation composite material includes: preparing a first mixture by mixing an inorganic binder and a filler with each other; preparing a second mixture by mixing a thermally conductive material with the first mixture; preparing a composite particle in which a surface of the filler is coated with the thermally conductive material by an inorganic coating layer formed by curing the inorganic binder, by thermally treating the second mixture; and preparing the thermal dissipation composite material by mixing the composite particle and a polymer material with each other. Due to the thermally conductive material in which the surface of the filler is coated with the thermally conductive material by the inorganic coating layer, thermal conductivity of the thermal dissipation composite material in vertical and horizontal directions can be improved, and a time and a cost for a manufacturing process of the thermal dissipation composite material can be reduced.

In addition, according to one embodiment, the OH functional group may be provided on the surface of the thermally conductive material. In this case, the OH functional group of the thermally conductive material may be chemically combined with the inorganic coating layer, so that the surface of the filler can be easily and stably coated with the thermally conductive material by the inorganic coating layer. In detail, a void among the inorganic coating layer, the thermally conductive material, and the filler can be minimized to minimize a thermal bottleneck phenomenon. In addition, the inorganic coating layer, the thermally conductive material, and the filler may form a chemical bond and a physical bond with each other by the inorganic coating layer, so that the composite particle that is structurally stable can be formed, and mechanical strength of the composite particle can be improved.

In addition, according to one embodiment, the composite particle may be provided to the polymer material, and curing may be performed, so that a thermal dissipation film can be prepared. As described above, the thermally conductive materials may be provided on the surfaces of the composite particles, and the thermally conductive materials may be connected to each other, so that a heat transfer path in the form of a network capable of continuously transferring heat can be formed. In this case, an anisotropic heat conduction phenomenon of the thermally conductive material (e.g., h-BN) can be improved to enable heat conduction in the vertical and horizontal directions, that is, isotropic heat conduction. In addition, in this case, within the thermal dissipation film, an interface between the thermally conductive material (e.g., h-BN) and the matrix formed of the polymer material can be minimized, and the thermally conductive material (e.g., h-BN) can make direct contact with the matrix. For this reason, thermal conductivity and electrical insulation properties of the thermal dissipation film can be improved. Accordingly, the thermal dissipation film can be applied to various industries such as fields of a head lamp of an LED, a CPU and a main board of a computer, a display, a mobile phone battery, and an electric vehicle.

MODE FOR INVENTION

Figure 1:
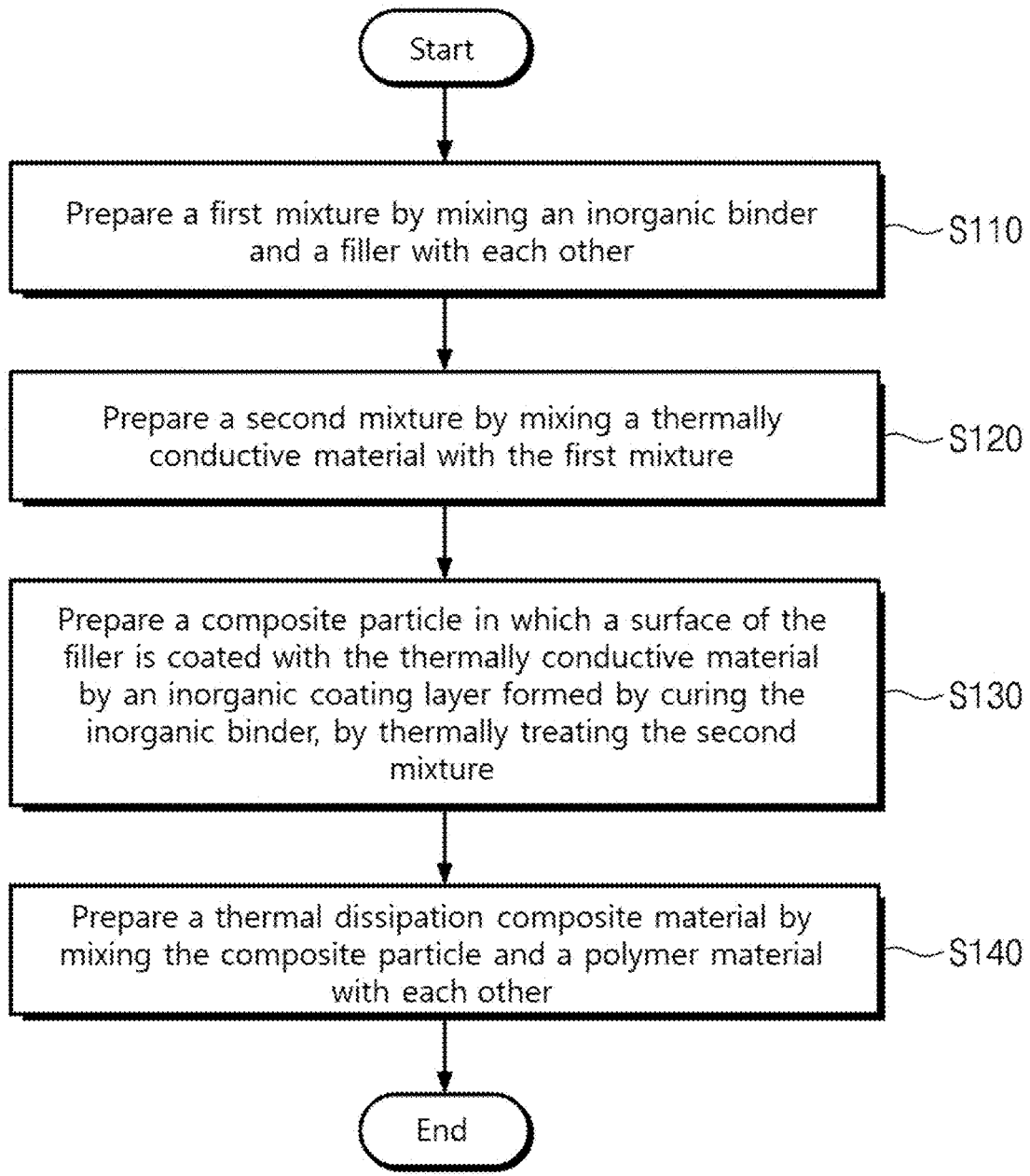
FIG. 1 is a flowchart for describing a method of manufacturing a thermal dissipation composite material according to an embodiment of the present invention.

Hereinafter, exemplary embodiments of the present invention will be described in detail with reference to the accompanying drawings. However, the technical idea of the present invention is not limited to the embodiments described herein, but may be realized in different forms. The embodiments introduced herein are provided to sufficiently deliver the idea of the present invention to those skilled in the art so that the disclosed contents may become thorough and complete.

When it is mentioned in the present disclosure that one element is on another element, it means that one element may be directly formed on another element, or a third element may be interposed between one element and another element. Further, in the drawings, thicknesses of films and areas are exaggerated for efficient description of the technical contents.

In addition, in the various embodiments of the present disclosure, the terms such as first, second, and third are used to describe various elements, but the elements are not limited to the terms. The terms are used only to distinguish one element from another element. Therefore, an element mentioned as a first element in one embodiment may be mentioned as a second element in another embodiment. The embodiments described and illustrated herein include their complementary embodiments. Further, the term "and/or" used herein is used to include at least one of the elements enumerated before and after the term.

As used herein, the terms of a singular form may include plural forms unless the context clearly indicates otherwise. Further, the tams such as "including" and "having" are used to designate the presence of features, numbers, steps, elements, or combinations thereof described in the present disclosure, and shall not be construed to preclude any possibility of the presence or addition of one or more other features, numbers, steps, elements, or combinations thereof. In addition, the term "connection" used herein is used to include both indirectly and directly connecting a plurality of elements.

Further, in the following description of the present invention, detailed descriptions of known functions and configurations incorporated herein will be omitted when they may make the subject matter of the present invention unnecessarily unclear.

Figure 2:
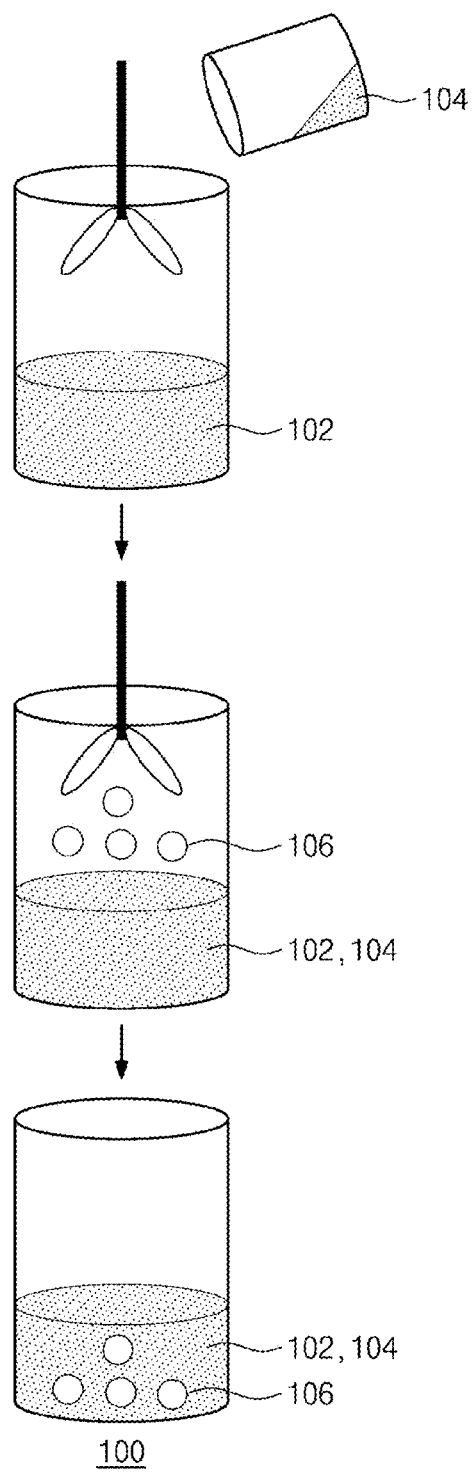
FIG. 2 is a view for describing a step of preparing a first mixture according to the embodiment of the present invention.
Figure 3:
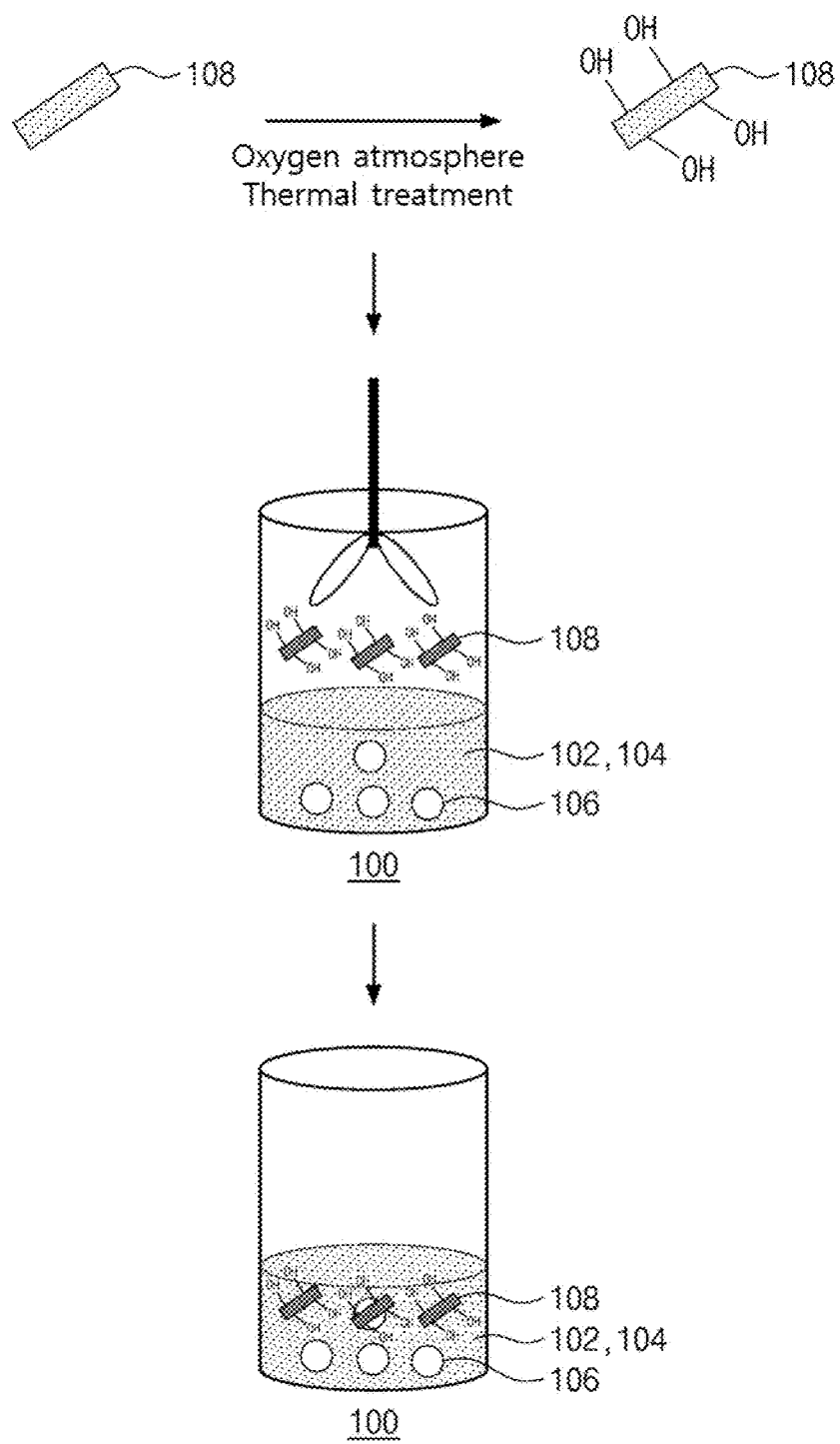
FIG. 3 is a view for describing a step of preparing a second mixture according to the embodiment of the present invention.
Figure 4:
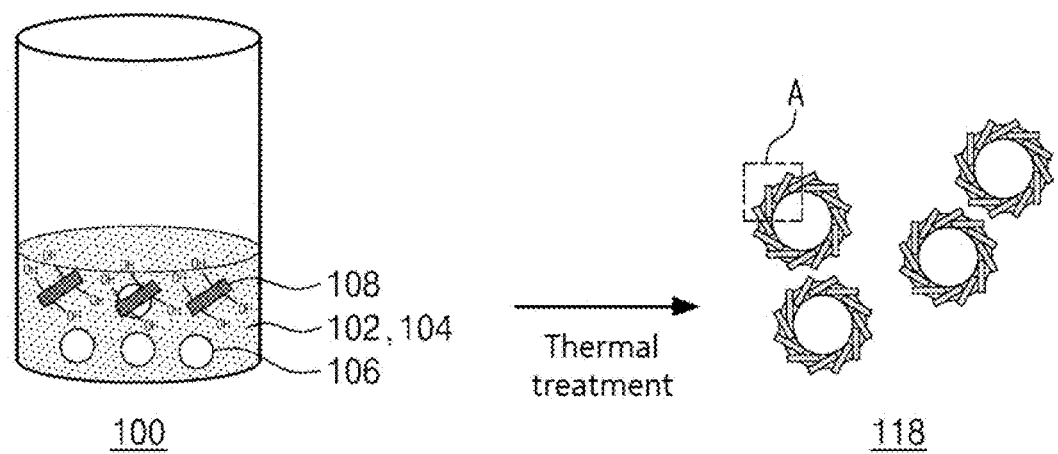
FIG. 4 is a view for describing a step of preparing a composite particle according to the embodiment of the present invention.
Figure 5:
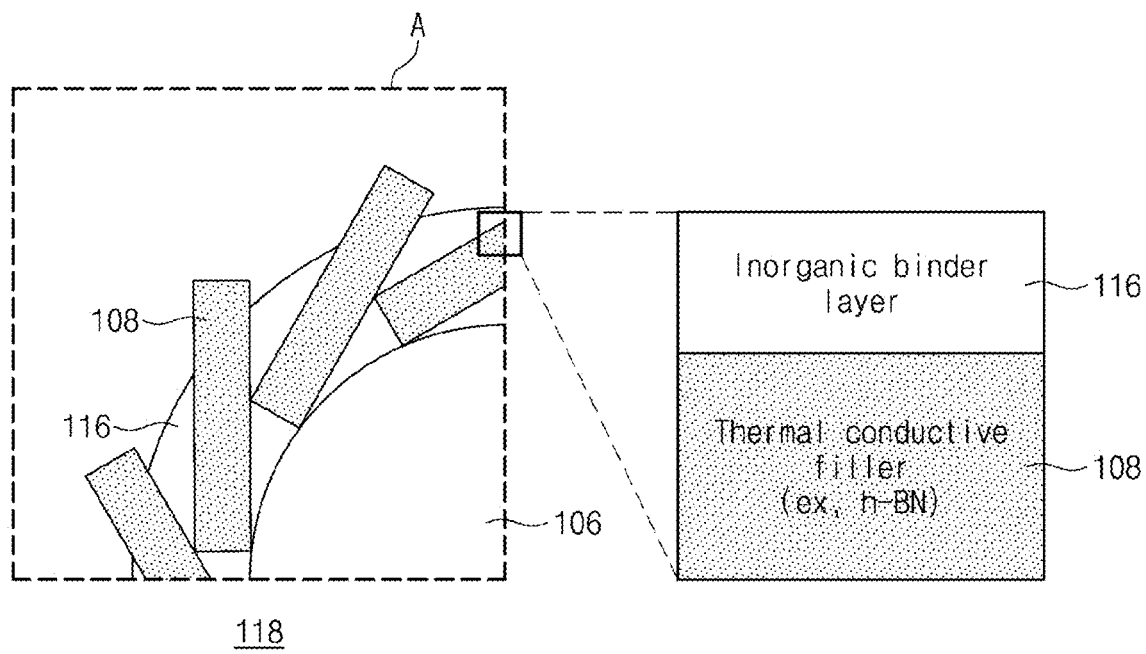
FIG. 5 is a view for describing a structure of the composite particle according to the embodiment of the present invention.
Figure 6:
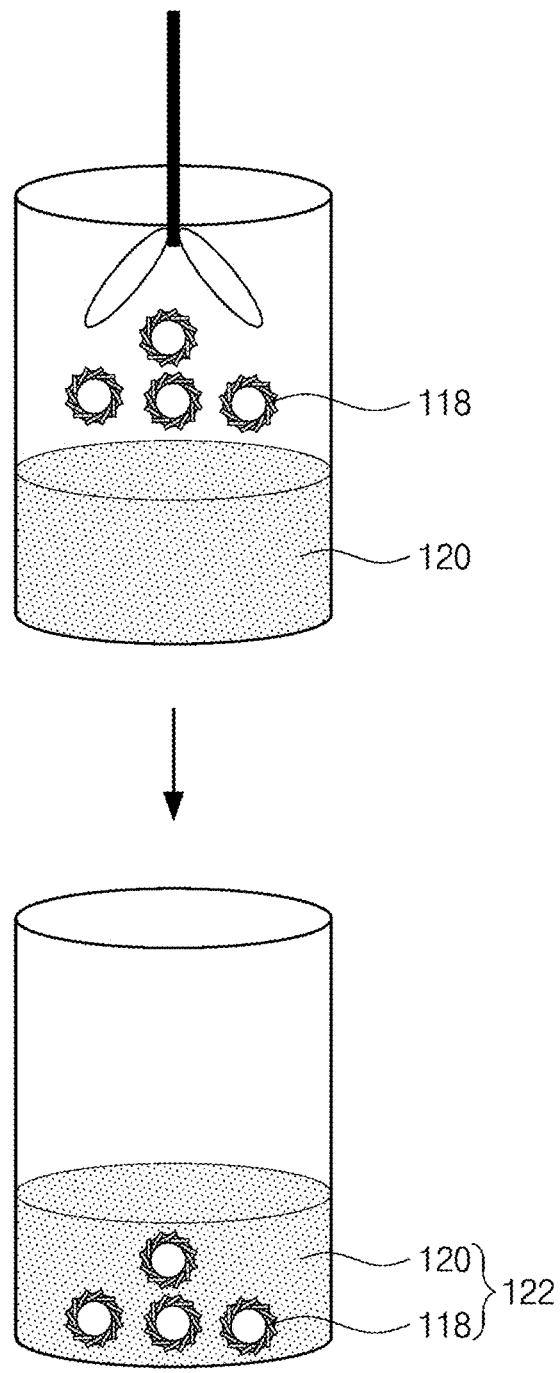
FIG. 6 is a view for describing a step of preparing a thermal dissipation composite material according to the embodiment of the present invention.
Figure 7:
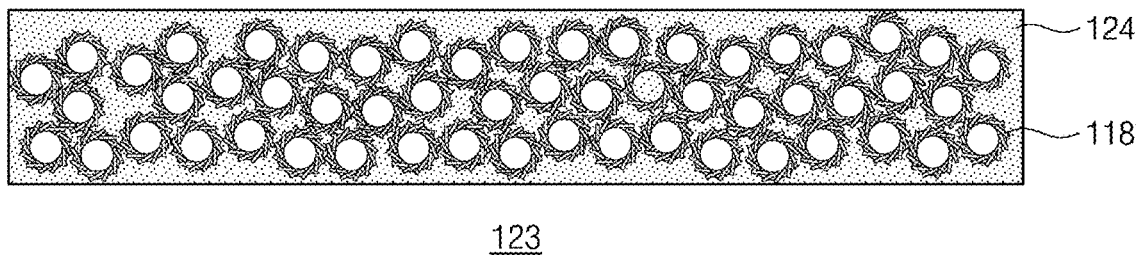
FIG. 7 is a view for describing a structure of a thermal dissipation film according to the embodiment of the present invention.
Figure 8:
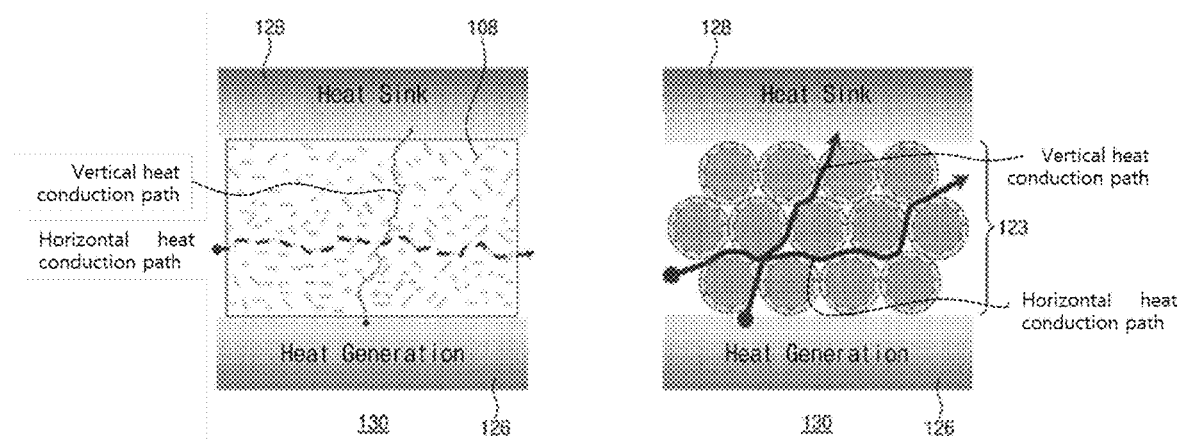
FIG. 8 is a view for describing a heat transfer path by the thermal dissipation film according to the embodiment of the present invention.

FIG. 1 is a flowchart for describing a method of manufacturing a thermal dissipation composite material according to an embodiment of the present invention, FIG. 2 is a view for describing a step of preparing a first mixture according to the embodiment of the present invention, FIG. 3 is a view for describing a step of preparing a second mixture according to the embodiment of the present invention, FIG. 4 is a view for describing a step of preparing a composite particle according to the embodiment of the present invention, FIG. 5 is a view for describing a structure of the composite particle according to the embodiment of the present invention, FIG. 6 is a view for describing a step of preparing a thermal dissipation composite material according to the embodiment of the present invention, FIG. 7 is a view for describing a structure of a thermal dissipation film according to the embodiment of the present invention, and FIG. 8 is a view for describing a heat transfer path by the thermal dissipation film according to the embodiment of the present invention.

Referring to FIGS. 1 and 2, a first mixture 100 may be prepared by mixing an inorganic binder 102 and a filler 106 with each other (S110).

The preparing of the first mixture 100 may include: providing a solvent 104 to the inorganic binder 102, and performing stirring; and preparing the first mixture 100 by providing the filler 106 to the solvent 104 and the inorganic binder 102, which are stirred, and performing stirring.

For example, the inorganic binder 102 may include at least one of compounds that form a metal oxide through a thermal treatment, such as a metal alkoxide including at least one alkoxide such as magnesium dialkoxide, aluminum triethoxide, or silicon trimethoxide, water glass, siloxane, or silazane. In detail, for example, the inorganic binder 102 may be sodium silicate including an OH functional group.

According to one embodiment, the solvent 104 may be a non-polar solvent. For example, the solvent 104 may include at least one of toluene and xylene. When toluene or xylene is used as the solvent 104, coating performance of the inorganic binder 102 may be improved.

For example, the filler 106 may be an aluminum oxide ($Al_2O_3$). As another example, the filter 106 may include at least one of a metal such as copper (Cu), iron (Fe), silver (Ag), magnesium (Mg), nickel (Ni), silicon (Si), aluminum (Al), or tungsten (W), and an oxide, a carbide, or a nitride, which is derived from the metal.

Alternatively, as another example, the filler 106 may have a core-shell structure including an aluminum oxide core and a silicon oxide shell. In this case, a thermally conductive material 108 having an OH functional group, which will be described below, may be easily combined with the filler 106.

According to one embodiment, the filler 106 may have a spherical shape, a wire shape, a rod shape, or a plate shape. Alternatively, according to another embodiment, fillers having different shapes such as a spherical shape, a wire shape, a rod shape, or a plate shape may be mixed with each other for use.

In addition, according to one embodiment, the filler 106 may have a spherical shape, in which fillers having mutually different diameters may be used. In this case, packing efficiency may be improved in a thermal dissipation film that will be described below, so that a continuous heat transfer network by the thermally conductive material that will be described below may be easily formed.

Referring to FIGS. 1 and 3, a second mixture 110 may be prepared by mixing a thermally conductive material 108 with the first mixture 100 (S120).

The preparing of the second mixture 110 may include: generating an OH functional group on a surface of the thermally conductive material 108 by thermally treating the thermally conductive material 108; and preparing the second mixture 110 by providing the thermally conductive material 108 on which the OH functional group is generated to the first mixture 100 and performing stirring.

According to one embodiment, the thermally conductive material 108 may be thermally treated in the oxygen atmosphere, so that the OH functional group may be generated on the surface of the thermally conductive material 108. For example, the thermal treatment of the thermally conductive material 108 may be performed at 900° C. for 2 hours. For example, the thermally conductive material 108 may be h-BN, which is a boron nitride-based material. As another example, the thermally conductive material 108 may include at least one of amorphous BN, c-BN, or a boron nitride nanotube (BNNT). Unlike the above-described example, for example, the thermally conductive material 108 may be a graphite-based material. As a specific example, the thermally conductive material 108 may include at least one of graphite, graphene, or a carbon nanotube (CNT).

The h-BN, which is thermally conductive material 108, may have high thermal conductivity and high electrical insulation. However, unlike the above-described embodiment of the present invention, when there is no OH functional group on the surface of the thermally conductive material 108, as will be described below, a surface of the filler 106 may not be easily coated with the thermally conductive material 108. In this case, the heat transfer path by the thermally conductive material 108 may not be formed as a continuous network. As a result, thermal conductivity of the thermal dissipation film 123 including the thermally conductive material 108 may be reduced.

Referring to FIGS. 1 and 4, a composite particle 118 may be prepared by thermally treating the second mixture 110 (S130).

The preparing of the composite particle 118 may include preparing the composite particle 118 in which a surface of the filler 106 is coated with the thermally conductive material 108 by an inorganic coating layer 116 formed by curing the inorganic binder 102, by thermally treating the second mixture 110.

According to one embodiment, the thermally treating of the second mixture 110 may further include drying the second mixture 110 before the thermal treatment. In detail, when the second mixture 110 is dried, the solvent 104 included in the inorganic binder 102 may be volatilized. For example, a drying temperature of the second mixture 110 may be 60° C.

According to one embodiment, when the dried second mixture 110 is thermally treated, as described above, the inorganic binder 102 may be cured, so that the inorganic coating layer 116 may be formed. For example, a thermal treatment temperature of the second mixture 110 may be 600° C. to 900° C.

When the thermally conductive material 108 is h-BN including an OH functional group, and the inorganic coating layer 116 is sodium silicate including an OH functional group, the OH functional group of the inorganic coating layer 116 and the OH functional group on the surface of the thermally conductive material 108 may be subject to a dehydration reaction to form a chemical bond in the form of B—O—Si, so that the surface of the filler 106 may be easily coated with the thermally conductive material 108. In this case, as will be described below, the heat transfer path by the thermally conductive material 108 may be formed as a continuous network. In addition, a void between the thermally conductive material 108 and the filler 106 by the inorganic coating layer 116 may be reduced, so that a thermal bottleneck phenomenon caused by the void may be minimized. Therefore, as will be described below, the thermal conductivity of the thermal dissipation film 123 may be improved.

Unlike the above-described embodiment of the present invention, when the surface of the thermally conductive material 108 does not include the OH functional group, the thermally conductive material 108 and the inorganic coating layer 116 may not be easily combined with each other. Accordingly, the surface of the filler 106 may not be easily coated with the thermally conductive material 108. In this case, as will be described below, the heat transfer path by the thermally conductive material 108 may not be formed as a continuous network. In addition, a void among the thermally conductive material 108 and the inorganic coating layer 116, which are not combined with each other, and the filler 106 may be increased, so that the thermal bottleneck phenomenon caused by the void may be increased. Therefore, as will be described below, the thermal conductivity of the thermal dissipation film 123 may be reduced.

Referring to FIG. 5, the composite particle 118 may include the filler 106, the inorganic coating layer 116, and the thermally conductive material 108. As described above, the surface of the filler 106 may be coated with the thermally conductive material 108 by the inorganic coating layer 116. In detail, when the thermally conductive material 108 is h-BN including an OH functional group, and the inorganic coating layer 116 is sodium silicate including an OH functional group, the inorganic coating layer 116 may form a chemical bond in the form of B—O—Si with the thermally conductive material 108. In addition, the thermally conductive material 108, the inorganic coating layer 116, and the filler 106 may be chemically and physically combined with each other through the thermal treatment. Therefore, a structure of the composite particle 118 may be stable, and mechanical strength of the composite particle 118 may be increased. As another example, the inorganic coating layer 116 may include at least one metal oxide such as a magnesium oxide, an aluminum oxide, or a silicon oxide.

Referring to FIGS. 1 and 6, the thermal dissipation composite material 122 may be prepared by mixing the composite particle 118 and a polymer material 120 with each other (S140).

The preparing of the thermal dissipation composite material 122 may include preparing the thermal dissipation composite material 122 by providing the composite particle 118 to the polymer material 120 and performing stirring. The polymer material 120 may be configured as a thermoplastic resin and a thermosetting resin polymer, which are used alone or used by blending at least two types thereof. For example, the polymer material 120 may be polydimethylsiloxane (PDMS). As another example, the polymer material 120 may include at least one of polymers having thermal conductivity, such as polyethylene (PE), polypropylene (PP), polymethyl methacrylate (PMMA), or polycarbonate (PC), which are used alone or used as a composite.

Referring to FIG. 7, the thermal dissipation film 123 may be prepared by providing the thermal dissipation composite material 122 to a mold, removing bubbles in the thermal dissipation composite material 122 with a vacuum pump, and performing thermal curing. For example, the mold may have a thickness of 1 mm. For example, the thermal curing may be performed at 80° C. for 1 hour.

The thermal dissipation film 123 may have a structure in which a plurality of composite particles 118 are distributed in a matrix 124 including the polymer material 120. In detail, a plurality of thermally conductive materials 108 may be connected to each other in the composite particles 118 so as to establish a continuous network, which is a heat transfer path. Accordingly, heat may be transferred in the thermal dissipation film 123 in the vertical and horizontal directions through the heat transfer path in the form of the continuous network. Accordingly, the thermal dissipation film 123 may be applied to an electronic element 130 to implement a thermal dissipation function.

Referring to FIG. 8, the electronic element 130 may include a heat generation 126, a heat sink 128, and the thermal dissipation film 123. In detail, the electronic element 130 may have a structure in which the thermal dissipation film 123 is inserted between the heat generation 126 and the heat sink 128. Therefore, heat generated from the heat generation 126 may be thermally conducted to the heat sink 128 through the thermally conductive material 108 of the thermal dissipation film 123. In addition, the heat conducted through the thermally conductive material 108 may be released to an outside through the heat sink 128.

As shown in FIG. 8, when the thermal dissipation film 123 is configured such that the filler 106 is omitted in the matrix 124 including the polymer material 120 while the thermally conductive materials 108 are distributed in the matrix 124, that is, the thermally conductive material 108 may not form a continuous heat transfer network. In this case, thermal conductivity in the vertical direction may be lower than thermal conductivity in the horizontal direction. In this case, the thermally conductive material (e.g., h-BN) of the thermal dissipation film 123 may exhibit an anisotropic heat conduction phenomenon due to covalent bonding and directionality of a crystal structure. In particular, since an intermolecular force (van der Waals force) between atoms in the vertical direction and phonon scattering at an interface occur, the thermally conductive material (e.g., h-BN) may have low thermal conductivity in the vertical direction. In addition, when the thermal dissipation film 123 is prepared by using the thermally conductive material (e.g., h-BN) while omitting the filler 106, the thermal conductivity in the vertical direction may be further reduced. In general, when a filling amount of the thermally conductive material (e.g., h-BN) is increased in order to increase the thermal conductivity of the thermal dissipation film 123 in the vertical direction, if the filling amount of the thermally conductive material (e.g., h-BN) exceeds a specific level, a void between the thermally conductive material (e.g., h-BN) and the matrix 124 may be increased, so that the thermal conductivity of the thermal dissipation film 123 in the vertical and horizontal directions may be reduced. In addition, when the filling amount of the thermally conductive material (e.g., h-BN) is increased, a manufacturing unit cost of the thermal dissipation film 123 may be increased. Further, when the thermal dissipation film 123 is prepared by using the thermally conductive material (e.g., h-BN) while omitting the filler 106, the thermally conductive materials (e.g., h-BN) may not be easily connected to each other, so that the matrix 124 may be present between the thermally conductive materials. Therefore, an interface between the thermally conductive material (e.g., h-BN) and the matrix 124 may be increased, so that the thermal conductivity of the thermal dissipation film 123 may be further reduced due to an increase in a thermal resistance between interfaces.

On the contrary, as in the embodiment of the present invention, when the thermal dissipation film 123 has a structure in which the composite particles 118 are distributed in the matrix 124 including the polymer material 120, the thermally conductive materials 108 may be connected to each other in the composite particles 118 of the thermal dissipation film 123 so as to form a heat transfer path having a continuous network structure. Accordingly, the thermal dissipation film 123 may conduct the heat through a continuous network, which is a heat transfer path, so that the thermal conductivity in the vertical and horizontal directions may be improved. In this case, when the thermally conductive material 108 is h-BN, as described above, the intermolecular force (van der Waals force) between atoms in the vertical direction and the phonon scattering at the interface may occur, so that the thermally conductive material (e.g., h-BN) may have low thermal conductivity in the vertical direction. However, the thermally conductive materials (e.g., h-BN) may form a continuous network, which is a heat transfer path, in the composite particles 118, so that the thermal conductivity of the thermal dissipation film 123 in the vertical direction may be increased. In other words, when the thermally conductive material (e.g., h-BN) forms a continuous heat transfer network, the thermally conductive materials (e.g., h-BN) may be directly connected to each other, so that an interface between the matrix 124 and the thermally conductive materials may be minimized. Therefore, the thermal resistance between the interfaces may be minimized, so that the thermal conductivity of the thermal dissipation film 123 may be improved.

In conclusion, when the thermally conductive material (e.g., h-BN) forms a continuous heat transfer network in the thermal dissipation film 123, the anisotropic heat conduction phenomenon of the thermally conductive material (e.g., h-BN) caused by the covalent bonding and the directionality of the crystal structure may be improved to enable heat conduction in the vertical and horizontal directions, that is, isotropic heat conduction of the thermal dissipation film 123.

In addition, as described above, according to the embodiment of the present invention, the method of manufacturing the thermal dissipation composite material 122 may include: preparing a first mixture 100 by mixing an inorganic binder 102 and a filler 106 with each other; preparing a second mixture 110 by mixing a thermally conductive material 108 with the first mixture 100; preparing a composite particle 118 in which a surface of the filler 106 is coated with the thermally conductive material 108 by an inorganic coating layer 116 famed by curing the inorganic binder 102, by thermally treating the second mixture 110; and preparing the thermal dissipation composite material 122 by mixing the composite particle 118 and a polymer material 120 with each other. Due to the thermally conductive material 108 in which the surface of the filler 106 is coated with the thermally conductive material 108 by the inorganic coating layer 116, the thermal conductivity of the thermal dissipation composite material 122 in the vertical and horizontal directions may be improved, and a time and a cost for a manufacturing process of the thermal dissipation composite material 122 may be reduced.

In addition, according to one embodiment, the OH functional group may be provided on the surface of the thermally conductive material 108. In this case, the OH functional group of the thermally conductive material 108 may be chemically combined with the inorganic coating layer 116, so that the surface of the filler 106 may be easily and stably coated with the thermally conductive material 108 by the inorganic coating layer 116. In detail, a void among the inorganic coating layer 116, the thermally conductive material 108, and the filler 106 may be minimized to minimize a thermal bottleneck phenomenon. In addition, the inorganic coating layer 116, the thermally conductive material 108, and the filler 106 may form a chemical bond and a physical bond with each other by the inorganic coating layer 116, so that the composite particle 118 that is structurally stable may be formed, and the mechanical strength of the composite particle may be improved.

In addition, according to one embodiment, the composite particle 118 may be provided to the polymer material 120, and curing may be performed, so that a thermal dissipation film 123 may be prepared. As described above, the thermally conductive materials 108 may be provided on the surfaces of the composite particles 118, and the thermally conductive materials 108 may be connected to each other, so that a heat transfer path in the form of a network capable of continuously transferring heat may be formed. In this case, the anisotropic heat conduction phenomenon of the thermally conductive material (e.g., h-BN) may be improved to enable the heat conduction in the vertical and horizontal directions, that is, the isotropic heat conduction. In addition, in this case, within the thermal dissipation film 123, the interface between the thermally conductive material (e.g., h-BN) and the matrix 124 formed of the polymer material 120 may be minimized, and the thermally conductive material (e.g., h-BN) may make direct contact with the matrix 124. For this reason, thermal conductivity and electrical insulation properties of the thermal dissipation film 123 may be improved. Accordingly, the thermal dissipation film 123 may be applied to various industries such as fields of a head lamp of an LED, a CPU and a main board of a computer, a display, a mobile phone battery, and an electric vehicle.

According to one modified example, the first mixture 100 including the filler 106 and the inorganic binder 102 may be thermally treated to form a first inorganic coating layer formed by coated the surface of the filler 106 with the inorganic binder 102, the first mixture 100 may be prepared by mixing the filler 106 on which the first inorganic coating layer is formed and the inorganic binder 102 with each other according to the step S110 of FIG. 1, the second mixture 110 may be prepared by performing the mixing by using the thermally conductive material 108 according to the step S120 of FIG. 1, and a second-type composite particle in which a surface of the first inorganic coating layer is coated with the thermally conductive material 108 by a second inorganic coating layer formed by curing the inorganic binder may be prepared by thermally treating the second mixture 110 according to the step S130 of FIG. 1. In other words, the second-type composite particle may include: the filler 106; the first inorganic coating layer formed on the surface of the filler 106; and the thermally conductive material 108 formed on the first inorganic coating layer, in which the first inorganic coating layer is coated with the thermally conductive material 108 by the second inorganic coating layer.

The composite particle 118 described with reference to FIGS. 1 to 5 may be defined as a first-type composite particle, and the second-type composite particle may be used together with the first-type composite particle to prepare the thermal dissipation film 123 by the method described with reference to FIGS. 6 and 7. In other words, the first-type composite particle, the second-type composite particle, and the polymer material 120 may be mixed with each other, so that a thermal dissipation film in which the first-type composite particle and the second-type composite particle are distributed in the matrix 124 including the polymer material 120 may be prepared. In this case, as described above, the second-type composite particle may include the first inorganic coating layer, so that the second-type composite particle may have a relatively larger size than the first-type composite particle. In other words, the first-type composite particle and the second-type composite particle having mutually different sizes may be easily prepared by using the filler 106 having the same size, and the thermal dissipation film may be prepared by using the first-type composite particle and the second-type composite particle having mutually different sizes, so that a packing rate of the composite particle may be improved in the thermal dissipation film, and thus a continuous heat transfer path may be easily formed, and thermal conductivity of the thermal dissipation film may be improved. Accordingly, a thermal dissipation film and a manufacturing method thereof, capable of reducing a manufacturing cost and simplifying a process, may be provided.

Hereinafter, specific experimental examples and characteristic evaluation of the thermal dissipation composite material according to the embodiment of the present invention will be described.

Method of Manufacturing Thermal Dissipation Composite Material According to Experimental Example 1

An aluminum oxide was prepared as a filler, h-BN was prepared as a thermally conductive material, sodium silicate was prepared as a binder (15 to 30 wt % aqueous solution), and polydimethylsiloxane was prepared as a polymer material. The aluminum oxide (40 vol %) and the sodium silicate (2 vol %) were mixed with each other and stirred to prepare a first mixture. The h-BN (20 vol %) was provided to the first mixture, and stirring was performed to prepare a second mixture. After drying the second mixture at 60° C., a thermal treatment was performed at 600° C. to 900° C. The thermally-treated second mixture was provided to the polydimethylsiloxane (38 vol %), and stirring was performed for 5 minutes to prepare a thermal dissipation composite material. The thermal dissipation composite material was provided in a mold (1 mm), air bubbles were removed by using a vacuum pump, and the thermal dissipation composite material was cured at 80° C. for 1 hour to prepare a thermal dissipation film.

Method of Manufacturing Thermal Dissipation Composite Material According to Experimental Example 2

A thermal dissipation film was prepared by performing the same process as in Experimental Example 1 except that (3-glycidyloxypropyl)trimethoxysilane (2 vol %), which is an organic binder, is used instead of the sodium silicate that is an inorganic binder.

Method of Manufacturing Thermal Dissipation Composite Material According to Experimental Example 3

An aluminum oxide was prepared as a filler, h-BN was prepared as a thermally conductive material, and polydimethylsiloxane was prepared as a polymer material. Sodium silicate was omitted, the aluminum oxide (40 vol %) and the h-BN (20 vol %) were mixed with the polydimethylsiloxane (40 vol %), and stirring was performed for 5 minutes to prepare a thermal dissipation composite material. Thereafter, a thermal dissipation film was prepared by performing the same process as in Experimental Example 1.

TABLE 1

| Classification | Filler Aluminum Oxide (vol %) | Thermally Conductive Material h-BN (vol %) | Inorganic Binder Sodium Silicate (vol %) | Organic Binder (3-glycidyloxypropyl)trimethoxysilane (vol %) | Polymer Material Polydimethylsiloxane (vol %) |
|---|---|---|---|---|---|
| Experimental Example 1 | 40 | 20 | 2 | — | 38 |
| Experimental Example 2 | 40 | 20 | — | 2 | 38 |
| Experimental Example 3 | 40 | 20 | — | — | 40 |

Figure 9:
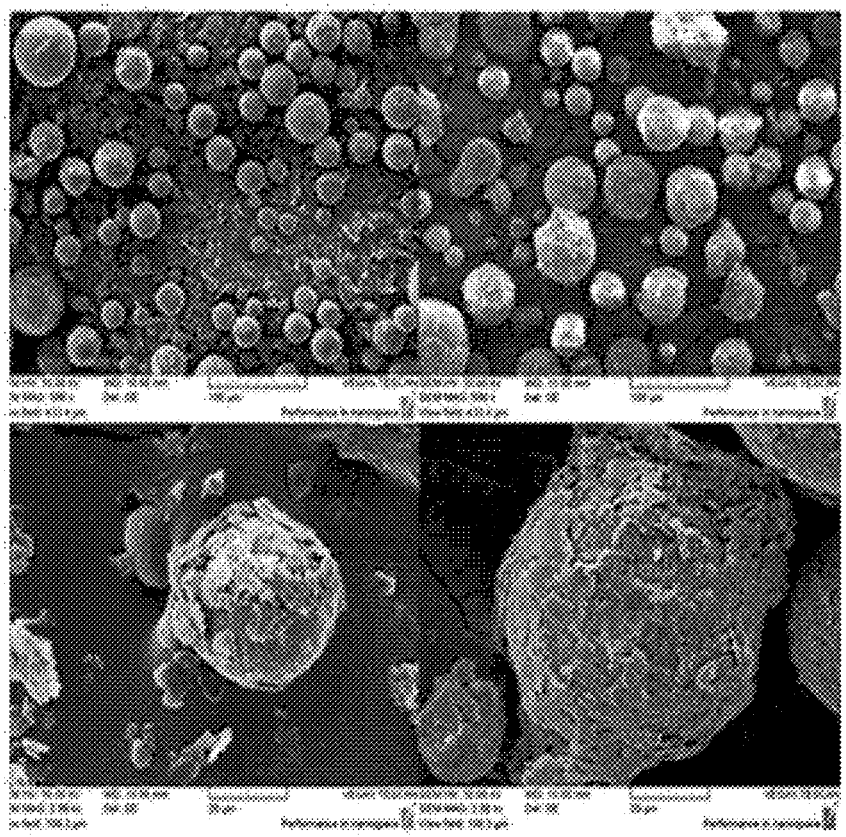
FIG. 9 is a scanning electron microscope (SEM) image of composite particles according to Experimental Examples 1 and 2.

FIG. 9 is a scanning electron microscope (SEM) image of composite particles according to Experimental Examples 1 and 2.

Referring to FIG. 9 and Table 1, it may be found that Experimental Example 1 is a composite particle prepared by using an aluminum oxide, h-BN, and sodium silicate, and Experimental Example 2 is a composite particle prepared by using an aluminum oxide, h-BN, and (3-glycidyloxypropyl) trimethoxysilane.

As shown in FIG. 9, it may be found that a surface of the aluminum oxide is more easily coated with the h-BN in the composite particle according to Experimental Example 1 as compared with the composite particle according to Experimental Example 2. In this case, it may be interpreted that the surface of the aluminum oxide is more easily coated with the h-BN as compared with the composite particle according to Experimental Example 2 because the sodium silicate including an OH group, that is, the inorganic coating layer and the h-BN including an OH group may form a chemical bond in the form of B—O—Si in a thermal treatment process, and a chemical bond and a physical bond among the inorganic coating layer, the h-BN, and the aluminum oxide may be formed.

In conclusion, the surface of the aluminum oxide may be more easily coated with the h-BN by the inorganic coating layer in the composite particle according to Experimental Example 1 as compared with the composite particle according to Experimental Example 2. In this case, the composite particle may be configured such that there is almost no void among the aluminum oxide, the inorganic coating layer, and the h-BN, so that a thermal bottleneck phenomenon may be significantly reduced. In addition, when the h-BNs are connected to each other in the composite particle according to Experimental Example 1 to establish a heat transfer path in the form of a continuous network, an area of an interface between the h-BN and the matrix including the polymer may be reduced, and a thermal resistance between interfaces may be reduced, so that high thermal conductivity may be obtained.

Therefore, it may be found that using the sodium silicate for the composite particle according to Experimental Example 1 is an effective scheme for improving the thermal conductivity by allowing the h-BN to establish the heat transfer path in the form of a continuous network when preparing the thermal dissipation film.

Figure 10:
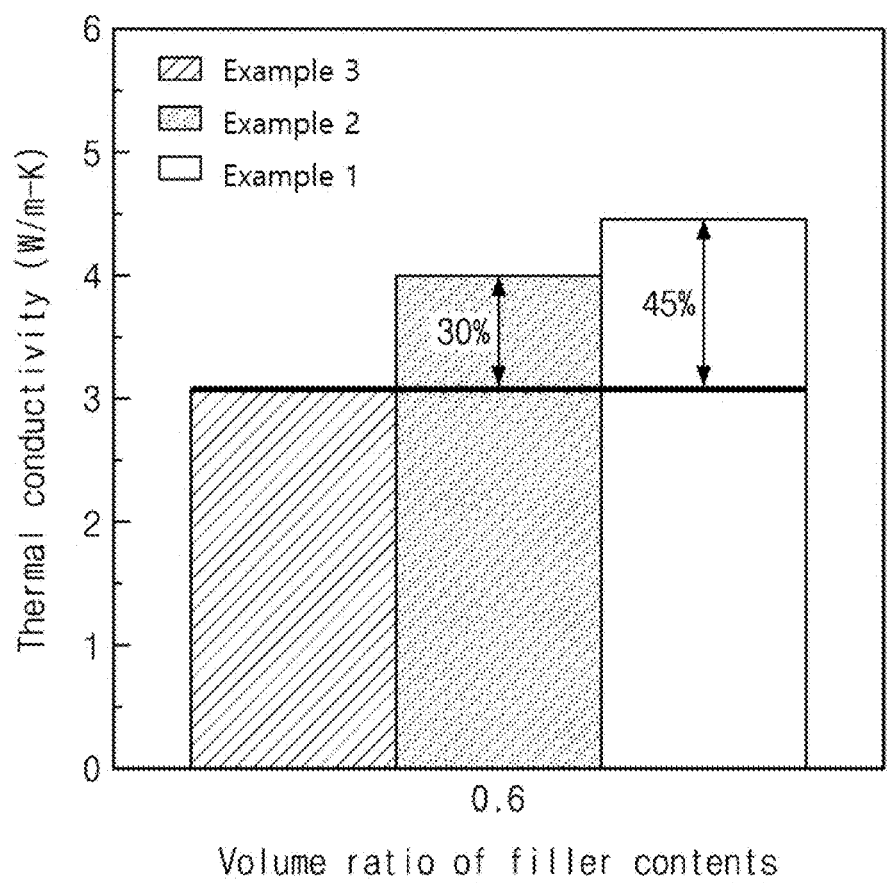
FIG. 10 is a graph showing thermal conductivity of thermal dissipation films according to Experimental Examples 1 to 3.

FIG. 10 is a graph showing thermal conductivity of thermal dissipation films according to Experimental Examples 1 to 3. Referring to FIG. 10 and Table 1, according to Experimental Examples 1 to 3, thermal conductivity of the thermal dissipation films according to the use of the binder and a type of the binder may be compared with each other. Although an aluminum oxide and h-BN were used in the same ratio of 40 vol % and 20 vol % in Experimental Examples 1 to 3, respectively, sodium silicate was used as an inorganic binder in Experimental Example 1, (3-glycidyloxypropyl)trimethoxysilane was used as an organic binder in Experimental Example 2, and Experimental Example 3 did not use a binder.

As shown in FIG. 10, when Experimental Example 1 and Experimental Example 3 are compared with each other by a comparative experiment on whether a binder is used, it may be found that the thermal conductivity of the thermal dissipation film is 45% higher in Experimental Example 1 using the sodium silicate. In addition, when Experimental Example 2 and Experimental Example 3 are compared with each other, it may be found that the thermal conductivity of the thermal dissipation film is 30% higher in Experimental Example 2 using the (3-glycidyloxypropyl)trimethoxysilane.

When a binder is used, it may be interpreted that the thermal conductivity of the thermal dissipation film is high in Experimental Example 1 and Experimental Example 2 because the surface of the aluminum oxide may be coated with the h-BN by the binder, and the h-BN may establish the heat transfer path in the form of a network.

On the contrary, in the general case where the binder is not used, since the thermal conductivity of the thermal dissipation film is low, the h-BN may be added in order to increase a filling amount of the h-BN. However, when the filling amount of the h-BN exceeds a specific level, a void between the h-BN and the matrix including the polymer may be increased in the thermal dissipation film, so that the thermal bottleneck phenomenon may occur. For this reason, the thermal conductivity of the thermal dissipation film may be significantly reduced. In addition, the h-BN has a high unit cost, so that a manufacturing unit cost of the thermal dissipation film may be increased as the filling amount increases.

In order to solve the above problem, using the binder may increase the thermal conductivity of the thermal dissipation film without adding the h-BN through a structure in which the h-BN having the same filling amount has an efficient heat transfer path, that is, a heat transfer path in the form of a network formed by connecting the h-BNs to each other. Therefore, it may be found that using the binder is an effective scheme for reducing a manufacturing process cost of the thermal dissipation film and increasing the thermal conductivity of the thermal dissipation film.

When Experimental Example 1 and Experimental Example 2 are compared with each other by a comparative experiment on the type of the binder, it may be found that the thermal conductivity of the thermal dissipation film was 15% higher in Experimental Example 1 using the sodium silicate as compared with Experimental Example 2 using (3-glycidyloxypropyl) trimethoxysilane.

It may be interpreted that the thermal conductivity of the thermal dissipation film is lower in Experimental Example 2 using the (3-glycidyloxypropyl)trimethoxysilane because while the surface of the aluminum oxide is combined and coated with the h-BN by an organic coating layer so that the h-BN may establish the heat transfer path in the form of a network, the thermal dissipation film of Experimental Example 2 may have more voids than the thermal dissipation film of Experimental Example 1 to cause the thermal bottleneck phenomenon, and may have more interfaces between the h-BN and the matrix to cause a higher thermal resistance between the interfaces than the thermal dissipation film of Experimental Example 1. In addition, it may be interpreted that the thermal conductivity of the thermal dissipation film is lower in the case of the (3-glycidyloxypropyl)trimethoxysilane due to phonon scattering at the interface.

On the contrary, in the case of Experimental Example 1 using the sodium silicate, the h-BN including an OH functional group and the inorganic coating layer including an OH functional group may be subject to a dehydration reaction by the sodium silicate, that is, the inorganic coating layer to form a chemical bond in the form of B—O—Si. In addition, as shown in FIG. 9 described above, the surface of the aluminum oxide may be more easily coated with the h-BN through a chemical bond and a physical bond among the aluminum oxide, the h-BN, and the inorganic coating layer as compared with Experimental Example 2. For this reason, when compared with the thermal dissipation film of Experimental Example 2, there is almost no void to cause no thermal bottleneck phenomenon, and the h-BNs may be connected to each other so that a thermal resistance between interfaces between the h-BN and the matrix may be low. Therefore, the thermal conductivity of the thermal dissipation film may be higher in Experimental Example 1 using the sodium silicate.

In conclusion, it may be found that Experimental Example 1 using the sodium silicate is an effective scheme for more easily coating the surface of the aluminum oxide with the h-BN and increasing the thermal conductivity of the thermal dissipation film by establishing a continuous heat transfer network path as compared with Experimental Example 2 using the (3-glycidyloxypropyl)trimethoxysilane.

Although the exemplary embodiments of the present invention have been described in detail, the scope of the present invention is not limited to a specific embodiment, and should be interpreted by the appended claims. In addition, it should be understood by those of ordinary skill in the art that various changes and modifications can be made without departing from the scope of the present invention.

INDUSTRIAL APPLICABILITY

The thermal dissipation composite material according to the embodiment of the present invention may be applied to fields of a head lamp of an LED, a CPU and a main board of a computer, a display, a mobile phone battery, and an electric vehicle.

The invention claimed is:

1. A method of manufacturing a thermal dissipation composite material, the method comprising:
   stirring sodium silicate as an inorganic binder with a nonpolar solvent, wherein the inorganic binder includes a first OH functional group, and wherein the nonpolar solvent includes toluene and xylene;
   preparing a first mixture by mixing the inorganic binder, the nonpolar solvent, and a filler;
   preparing a second mixture by mixing a thermally conductive material with the first mixture;
   thermally treating the second mixture at between 600° C. and 900° C., thereby curing the inorganic binder and preparing a composite particle, wherein the composite particle comprises a particle of the filler having a surface coated with the thermally conductive material and an inorganic coating layer formed by curing the inorganic binder; and
   preparing the thermal dissipation composite material by mixing the composite particle and a polymer material with each other.

2. The method of claim 1, wherein the first mixture is prepared by adding the filler to the nonpolar solvent and the inorganic binder.

3. The method of claim 1, wherein the second mixture is prepared by:
   generating a second OH functional group on a surface of the thermally conductive material by thermally treating the thermally conductive material; and
   stirring the thermally conductive material on which the second OH functional group is generated with the first mixture.

4. The method of claim 3, wherein
   the thermally conductive material is thermally treated in an oxygen atmosphere, and
   the thermally conductive material on which the second OH functional group is generated and the inorganic coating layer are chemically combined with each other.

5. The method of claim 1, wherein the inorganic binder further includes at least one of magnesium dialkoxide, aluminum triethoxide, silicon trimethoxide, siloxane, or silazane.

* * * * *